United States Patent
Liu et al.

(10) Patent No.: US 7,253,111 B2
(45) Date of Patent: *Aug. 7, 2007

(54) BARRIER POLISHING SOLUTION

(75) Inventors: Zhendong Liu, Newark, DE (US);
John Quanci, Haddonfield, NJ (US);
Robert E. Schmidt, Bear, DE (US);
Terence M. Thomas, Newark, DE (US)

(73) Assignee: Rohm and Haas Electronic Materials CMP Holding, Inc., Newark, DE (US)

( * ) Notice: Subject to any disclaimer, the term of this patent is extended or adjusted under 35 U.S.C. 154(b) by 84 days.

This patent is subject to a terminal disclaimer.

(21) Appl. No.: 10/830,268

(22) Filed: Apr. 21, 2004

(65) Prior Publication Data

US 2005/0236601 A1 Oct. 27, 2005

(51) Int. Cl.
*H01L 21/302* (2006.01)

(52) U.S. Cl. .................... 438/691; 252/79.4; 252/79.1; 252/79.2; 252/79.3; 510/254; 510/255; 510/257; 106/14.05

(58) Field of Classification Search ................. 438/691
See application file for complete search history.

(56) References Cited

U.S. PATENT DOCUMENTS

| | | | |
|---|---|---|---|
| 5,614,444 A | 3/1997 | Farkas et al. | |
| 5,769,689 A | 6/1998 | Coosaboon et al. | |
| 5,863,838 A | 1/1999 | Farkas et al. | |
| 6,001,730 A | 12/1999 | Farkas et al. | |
| 6,083,840 A | 7/2000 | Mravic et al. | |
| 6,117,775 A | 9/2000 | Kondo et al. | |
| 6,136,711 A | 10/2000 | Grumbine et al. | |
| 6,194,317 B1* | 2/2001 | Kaisaki et al. | 438/692 |
| 6,316,366 B1 | 11/2001 | Kaufman et al. | |
| 6,322,600 B1 | 11/2001 | Brewer et al. | |
| 6,375,693 B1 | 4/2002 | Cote et al. | |
| 6,376,361 B1 | 4/2002 | Chooi et al. | |
| 6,409,781 B1 | 6/2002 | Wojtczak et al. | |
| 6,436,811 B1 | 8/2002 | Wake et al. | |
| 6,447,563 B1 | 9/2002 | Mahulikar | |
| 6,468,913 B1 | 10/2002 | Pasqualoni et al. | |
| 6,592,433 B2 | 7/2003 | Buehler | |
| 6,692,546 B2* | 2/2004 | Ma et al. | 51/298 |
| 7,018,560 B2* | 3/2006 | Liu et al. | 252/79.4 |
| 2002/0019128 A1 | 2/2002 | Lee et al. | |
| 2002/0020134 A1* | 2/2002 | Collard | 52/694 |
| 2002/0032987 A1 | 3/2002 | Steckenrider et al. | |
| 2002/0042199 A1 | 4/2002 | Bian et al. | |
| 2002/0066234 A1 | 6/2002 | Cote et al. | |
| 2002/0081853 A1 | 6/2002 | Beitel et al. | |
| 2002/0104269 A1 | 8/2002 | Sun et al. | |
| 2002/0106897 A1 | 8/2002 | Bian et al. | |
| 2002/0124474 A1 | 9/2002 | Wojtczak et al. | |
| 2002/0139055 A1 | 10/2002 | Asano et al. | |
| 2002/0170237 A1* | 11/2002 | Vogt et al. | 51/308 |
| 2003/0064671 A1 | 4/2003 | Pasqualoni et al. | |
| 2003/0077985 A1 | 4/2003 | Zhou et al. | |
| 2003/0131535 A1 | 7/2003 | Small et al. | |
| 2003/0159362 A1 | 8/2003 | Singh et al. | |
| 2004/0009671 A1 | 1/2004 | Kaufman et al. | |
| 2004/0020134 A1* | 2/2004 | Kim et al. | 51/307 |
| 2004/0147188 A1 | 7/2004 | Liu et al. | |
| 2004/0203324 A1* | 10/2004 | Smith et al. | 451/41 |
| 2005/0029491 A1 | 2/2005 | Liu | |
| 2005/0031789 A1 | 2/2005 | Liu et al. | |
| 2005/0066585 A1* | 3/2005 | Bian et al. | 51/307 |
| 2005/0090104 A1* | 4/2005 | Yang et al. | 438/689 |

FOREIGN PATENT DOCUMENTS

| | | |
|---|---|---|
| EP | 0 811 665 A2 | 12/1997 |
| EP | 1 081 200 A1 | 3/2001 |
| EP | 1 229 093 A | 8/2002 |
| EP | 1 235 261 A1 | 8/2002 |
| WO | WO 98/29515 A1 | 7/1998 |
| WO | WO 99/67056 A1 | 12/1999 |
| WO | WO 00/00567 A1 | 1/2000 |
| WO | WO 00/24842 A1 | 5/2000 |
| WO | WO01/95381 A2 | 12/2001 |
| WO | WO 02/18099 A2 | 3/2002 |
| WO | WO 03/072670 A1 | 9/2003 |

OTHER PUBLICATIONS

Steigerwald, J.M.; Murarka, S.P.; Duquette, D.J.; Gutmann, R.J.; "Surface Layer Formation During the Chemical Mechanical Polishing of Copper Thin Films", Mat. Res. Soc. Symp. Proc., 1994, pp. 133-139, vol. 337; Materials Research Society.

Luo, Q.; Campbell, D.R.; Babu, S.V.; "Chemical-Mechanical Polishing of Copper in Acidic Media"; CMP-MIC Catalog No. 961SMIC-100P/96/0145, Feb. 22-23, 1996; pp. 145-151.

Carpio, R.; Farkas, J.; Jairath, R.; "Initial study on copper CMP slurry chemistries", Thin Solid Films 266, 1995, pp. 238-244; Elsevier Science S.A.

Van Muylder, J.; Pourbaix, M.; "Tantalum(1)", Atlas of Electrochemical Equilibria in Aqueous Solutions, Section 9.3, 1966, pp. 251-255; Pergamon Press, Oxford, England.

Brusic, V.; Kistler, R.; Wang, S.; Hawkins, J.; Schmidt, C.; "A Cautious Approach to the Removal of Ta in the CMP Polishing of Cu/Ta Structures", Electrochemical Society Proceedings, 1998, pp. 119-125, vol. 98-7.

(Continued)

*Primary Examiner*—Nadine G. Norton
*Assistant Examiner*—Patricia A George
(74) *Attorney, Agent, or Firm*—Blake T. Biederman

(57) ABSTRACT

The polishing solution is useful for preferentially removing barrier materials in the presence of nonferrous interconnect metals with limited erosion of dielectrics. The polishing solution comprises 0 to 20 weight percent oxidizer, at least 0.001 weight percent inhibitor for reducing removal rate of the nonferrous interconnect metals, 10 ppb to 4 weight percent complexing agent, 0 to 50 weight percent abrasive and balance water; and the solution having a pH of less than 7.

10 Claims, No Drawings

OTHER PUBLICATIONS

Li, Y.; Hariharaputhiran, M.; Babu, S.V.; "Chemical-mechanical polishing of copper and tantalum with silica abrasives"; J. Mater. Res., Apr. 2001, pp. 1066-1073, vol. 16, No. 4; Materials Research Society.

Li, Y.; Babu, S.V.; "Copper and Tantalum Chemical-Mechanical Planarisation: Some Recent Progress"; Semiconductor Fabtech, Mar. 2001, pp. 259-261, 13th Edition.

Li, Y; Babu, S.V.; "Chemical Mechanical Polishing of Copper and Tantalum in Potassium Iodate-Based Slurries"; Electrochemical and Solid-State Letters, 2001, 4 (2), pp. G20-G22; The Electrochemical Society, Inc.

Ramarajan, S.; "Chemical-Mechanical Planarization of Copper/Tantalum for Microelectronic Applicaitons"; Ph. D. Thesis, Clarkson University, Jun. 23, 2000; UMI Dissertation Services, Ann Arbor, MI.

Hariharaputhiran, M.; "Mechanism of Dissolution and Planarization of Copper/Tantalum Films during Chemical-Mechanical Polishing", Ph. D. Thesis, Clarkson University, Jul. 24, 2000; UMI Dissertation Services, Ann Arbor, MI.

* cited by examiner

BARRIER POLISHING SOLUTION

BACKGROUND OF THE INVENTION

The invention relates to chemical mechanical planarizing (CMP) formulations for removing barrier metals and, more particularly, to polishing compositions for selectively removing barrier metals in the presence of interconnect structures in integrated circuit devices.

In recent years, the semiconductor industry has increasingly relied upon copper electrical interconnects in forming integrated circuits. These copper interconnects have a low electrical resistivity and a high resistance to electromigration. Since copper is very soluble in many dielectric materials, such as silicon dioxide and low-K or doped versions of silicon dioxide, a diffusion barrier layer is necessary to prevent the diffusion of copper into the underlying dielectric material. Typical barrier materials include, tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

In response to increasing demands for high density integrated circuits, semiconductor producers now fabricate integrated circuits containing multiple overlying layers of metal interconnect structures. During device fabrication, planarizing each interconnect layer improves packing density, process uniformity, product quality and most importantly, enables manufacturing of multiple layer integrated circuits. Semiconductor producers rely upon chemical-mechanical-planarizing (CMP) as a cost effective means of producing flat substrate surfaces. The CMP process is typically carried out in a two-step sequence. First, the polishing process uses a "first-step" slurry specifically designed to rapidly remove copper. For example, Carpio et al., in "Initial Study on Copper CMP Slurry Chemistries" Thin Solid Films, 262 (1995), disclose the use on a 5 weight percent nitric acid solution for efficient copper removal. Similarly, Kondo et al., in U.S. Pat. No. 6,117,775, disclose the use of nitric acid and BTA for copper removal.

After the initial copper removal, a "second-step" slurry removes the barrier material. Typically, second-step slurries require excellent selectivity to remove the barrier material without adversely impacting the physical structure or electrical properties of the interconnect structure.

Because it was traditionally perceived that alkaline polishing slurries have a much higher tantalum and tantalum nitride removal rate than acidic slurries, commercial second-step slurries typically have a neutral-to-basic pH. Another factor pointing to the advantages of neutral to basic pH barrier metal polishing slurries relates to the need to preserve the metal overlying the barrier metal during the second-step polishing. The metal removal rate should be very low to reduce dishing of the metal interconnects.

In acidic slurries that include oxidizing agents, copper tends to have both a high removal rate and a high static etch rate. Cote et al. however, in U.S. Pat. No. 6,375,693, disclose an acidic CMP slurry for barrier materials. The slurry of Cote et al. operates with a hydrogen peroxide oxidizer, a benzotriazole inhibitor and a sulfated fatty acid at a pH range of 2 to 7.5. Similarly, Wojtczak et al., in U.S. Pat. No. 6,409,781, disclose an acidic polishing slurry that relies upon a potassium iodate oxidizer, iminodiacetic acid as the copper corrosion inhibitor and nitric acid as the copper activator to selectively polish the barrier material. Unfortunately, acidic polishing slurries can have stability problems wherein the slurry undergoes a yellowing or other color change. This yellowing occurs after the addition of hydrogen peroxide to the acidic polishing slurry. Furthermore, since polishing slurries typically have a pot-life of several days, this yellowing phenomena can result in a slurry that darkens with time. And this color change can be an indicator of changing polishing performance that can result in decreased semiconductor wafer yields.

Future low k and ultra-low k integrations of the IC structure will require low metal and dielectric losses in the CMP step. Accordingly, a selective slurry for barrier removal will most probably be adopted. While neutral-to-basic polishing slurries have advantages known to those skilled in the art, such as those described above, these slurries also tend to have low tantalum removal rates. In addition, because tantalum is readily oxidized, the oxidizing agents in the slurry can react with the tantalum to form an oxide layer on the surface. In view of the above, there exists a need to provide a second-step slurry that possesses a high removal rate of barrier materials, excellent selectivity to interconnect metals and controlled removal of dielectric materials. In addition, there is a need for a slurry with sufficient stability over time to avoid the adverse color change associated with acidic barrier slurries.

STATEMENT OF THE INVENTION

The invention provides a polishing solution useful for preferentially removing barrier materials in the presence of nonferrous interconnect metals with limited erosion of dielectrics comprising: 0 to 20 weight percent oxidizer, at least 0.001 weight percent inhibitor for reducing removal rate of the nonferrous interconnect metals, 10 ppb to 4 weight percent complexing agent, 0 to 50 weight percent abrasive and balance water; and the solution having a pH of less than 7.

In another aspect, the invention provides a polishing solution useful for preferentially removing barrier materials in the presence of nonferrous interconnect metals with limited erosion of dielectrics comprising 0.01 to 15 weight percent oxidizer, 0.001 to 10 weight percent inhibitor for reducing removal rate of the nonferrous interconnect metals, 100 ppb to 2 weight percent complexing agent, 0 to 10 weight percent surfactant, 0.1 to 40 weight percent abrasive and balance water the solution having a pH of less than or equal to 5.

In another aspect, the invention provides a method of polishing semiconductor substrates, including the steps of: polishing the semiconductor substrate with a polishing solution and a polishing pad, the polishing solution useful for preferentially removing barrier materials in the presence of nonferrous interconnect metals with limited erosion of dielectrics comprising: 0 to 20 weight percent oxidizer, at least 0.001 weight percent inhibitor for reducing removal rate of the nonferrous interconnect metals, 10 ppb to 4 weight percent complexing agent, 0 to 50 weight percent abrasive and balance water; and the solution having a pH of less than 7.

DETAILED DESCRIPTION

It has been discovered that complexing agents can improve acidic barrier removal solutions by reducing the yellowing of polishing slurries without adversely affecting wafer uniformity or the selective removal of barrier films in patterned wafers. This increases the pot-life performance of the acidic barrier slurry. For purposes of this specification, complexing agents represent constituents that bond with metal ions, act as chelating agents or otherwise associate with free metal ions to decrease the free metal ion concentration of at least one metal ion in the polishing solution. For purposes of the specification, polishing solution refers to aqueous polishing solutions that may or may not include abrasives. If the polishing solution includes an abrasive, then the polishing solution also is a polishing slurry. The polishing solution can also optionally include surfactants, pH buffers, defoaming agents and biocides.

For purposes of this specification, dielectric includes silica-base materials such as TEOS, low k and ultra-low k materials (some ultra-low materials are not silica-base). To polish low k and ultra-low k dielectric materials, it is important to maintain low pressure to decrease the delamination and fracture of these materials. However, low pressure yields low barrier material (Ta/TaN) removal rate, which is undesirable for wafer throughput. Fortunately, acidic polishing solutions having a strong oxidizer have demonstrated high barrier removal rates in comparison to conventional alkaline barrier slurries that operate at low pressures. The barrier material may include the following: tantalum, tantalum nitride, tantalum-silicon nitrides, titanium, titanium nitrides, titanium-silicon nitrides, titanium-titanium nitrides, titanium-tungsten, tungsten, tungsten nitrides and tungsten-silicon nitrides.

The barrier metal polishing composition optionally includes an abrasive for "mechanical" removal of the barrier material. The CMP composition includes an abrasive for "mechanical" removal of barrier layers. The abrasive is preferably a colloidal abrasive. Example abrasives include the following: inorganic oxide, metal boride, metal carbide, metal hydroxide, metal nitride, or a combination comprising at least one of the foregoing abrasives. Suitable inorganic oxides include, for example, silica ($SiO_2$), alumina ($Al_2O_3$), zirconia ($ZrO_2$), ceria ($CeO_2$), manganese oxide ($MnO_2$), and mixtures thereof. Alumina is available in many forms such as alpha-alumina, gamma-alumina, delta-alumina, and amorphous (non-crystalline) alumina. Other suitable examples of alumina are boehmite (AlO(OH)) particles and mixtures thereof. Modified forms of these inorganic oxides such as polymer-coated inorganic oxide particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, and mixtures comprising at least one of the foregoing metal carbides, boride and nitrides. Diamond may also be utilized as an abrasive if desired. Alternative abrasives also include polymeric particles and coated polymeric particles. The preferred abrasive is silica.

The abrasive has a concentration in the aqueous phase of the polishing composition of 0 to 50 weight percent—this specification refers to all concentrations in weight percent, unless specifically expressed otherwise. For abrasive-free solutions, a fixed abrasive pad assists with the removal of the barrier layer. Preferably, the abrasive concentration is 0.1 to 40 weight percent. And most preferably, the abrasive concentration is 0.25 to 35 weight percent. Typically, increasing abrasive concentration increases the removal rate of dielectric materials; and it especially increases the removal rate of low k dielectric materials, such as carbon-doped oxide. For example, if a semiconductor manufacturer desires an increased low k dielectric removal rate, then increasing the abrasive content can increase the dielectric removal rate to the desired level.

The abrasive preferably has an average particle size of less than 250 nm for preventing excessive metal dishing and dielectric erosion. For purposes of this specification, particle size refers to the colloidal silica's average particle size. Most preferably, the silica has an average particle size of less than 100 nm to further reduce metal dishing and dielectric erosion. In particular, an average abrasive particle size less than 15 nm removes the barrier metal an acceptable rate without excessive removal of the dielectric material. For example, the least dielectric erosion and metal dishing occur with a colloidal silica having an average particle size is 2 to 15 nm. Decreasing the size of the colloidal silica tends to improve the selectivity of the solution; but it also tends to decrease the barrier removal rate. In addition, the preferred colloidal silica may include additives, such as dispersants to improve the stability of the silica at acidic pH ranges. One such abrasive is colloidal silica that is available from Clariant S. A., of Puteaux, France.

In addition, high purity silica particles can also serve to decrease the yellowing rate of the polishing solutions. For example maintaining total transition metal concentration to less than 1 part per million (ppm) further increases the solution's ability to decrease yellowing. Furthermore, limiting potassium and sodium to less than 1 ppm reduces adverse diffusion of these detrimental components into dielectric layers.

Optionally, the removal rate of barrier layers, such as tantalum, tantalum nitride, titanium and titanium nitride is preferably optimized by the use of an oxidizing agent. Suitable oxidizers include, for example, hydrogen peroxide, monopersulfates, iodates, magnesium perphthalate, peracetic acid and other peracids, persulfates, bromates, periodates, nitrates, iron salts, cerium salts, manganese (Mn) (III), Mn (IV) and Mn (VI) salts, silver salts, copper salts, chromium salts, cobalt salts, halogens, hypochlorites, or combinations comprising at least one of the foregoing oxidizers. The preferred oxidizer is hydrogen peroxide. It is to be noted that the oxidizer is typically added to the polishing composition just prior to use and in these instances the oxidizer is contained in a separate package.

It is desirable to use an amount of 0 to 20 weight percent oxidizer. Preferably, the oxidizer is 0.001 to 15 weight percent. Most preferably, the composition contains 0.05 to 10 weight percent oxidizer. Adjusting the amount of oxidizer, such as peroxide can also control the metal interconnect removal rate. For example, increasing the peroxide concentration increases the copper removal rate. Excessive increases in oxidizer, however, provide an adverse impact upon polishing rate.

Additionally, the solution contains at least 0.001 weight percent inhibitor to control nonferrous interconnect removal rate by static etch or other removal mechanism. Adjusting the concentration of an inhibitor adjusts the nonferrous interconnect metal removal rate by protecting the metal from static etch. Preferably, the solution contains 0.001 to 10 weight percent inhibitor for inhibiting static etch of nonferrous metal, for example, copper interconnects. Most preferably, the solution contains 0.05 to 2 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole and imidazole. BTA is a particularly effective inhibitor for copper and silver interconnects.

The polishing composition has a pH of less than 7 and a balance water. Preferably, the pH is less than or equal to 5. Optionally, the polishing composition includes an inorganic pH adjusting agent to reduce the pH of the polishing composition to an acidic pH less than 7 with a balance water.

Preferably, the pH adjusting agent only contains an impurity level concentration of metallic ions. In addition, the solution most preferably relies upon a balance of deionized water to limit incidental impurities. The pH adjusting agent can be either an organic or inorganic acid. Example organic acids include at least one of acetic acid, citric acid, malic acid, maleic acid, glycolic acid, phthalic acid, oxalic acid, malonic acid, lactic acid, succinic acid, tartaric acid and mixtures thereof. Preferably, the pH adjusting agent is an inorganic acid, such as nitric acid, sulfuric acid, hydrochloric acid, hydrofluoric acid and phosphoric acid. The most advantageous pH adjusting agent is nitric acid ($HNO_3$). Typically, the solution has a pH of 1.5 to 5. Most preferably, the pH is 2 to 4.

At a pH below 5, the polishing composition can provide a high barrier metal removal rate, even with a relatively low abrasive concentration. This low abrasive concentration can improve the polishing performance of a CMP process by reducing undesired abrasive induced defects, such as scratching. In addition, at a pH below 4, the polishing composition can be formulated with abrasive particles having a relatively small particle size. For example, a particle size of as small as approximately 10 nm still provides an acceptable Ta/TaN removal rate. By employing an abrasive having a relatively small particle size and formulating the acidic polishing composition at a low abrasive concentration, polishing defects are reduced to excellent levels.

Typical complexing agents include carboxylic acids, multi-carboxylic acids, aminocarboxylic acids, multi-amine compounds and mixtures thereof. Specific complexing agents include the following: acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, gluteric acid, salicylic acid, nitrilotriacetic acid, ethylenediamine, hydroxyethylenethylenediaminetetraacetic acid, hydroxyquinoline, tartaric acid, sodium diethyl dithiocarbamate, succinic acid, sulfosalicylic acid, triglycolic acid thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof. Some organic acids, such as citric acid may serve as both a complexing agent and a pH adjusting agent.

An amount of 10 parts per billion (ppb) to 4 weight percent complexing agent can control the discoloration of the polishing solution. Preferably, the polishing solution contains 100 ppb to 2 weight percent complexing agent. Most preferably, the polishing solution contains 1 ppm to 1 weight percent complexing agent. Insufficient complexing agent can result in unstable polishing slurries (polishing slurries that undergo a color change with too short a time period); and excessive complexing agent can adversely impact polishing rate.

Alternatively, additional complexing agents or water-soluble polymers may serve to further increase the removal rate of the nonferrous interconnect metal. For example, an addition of 0.01 to 5 weight percent water soluble polymer can serve to increase the nonferrous interconnect metal rate to an acceptable level. For example, polyacrylic acid having a weight average molecular weight of 100 to 100,000 is particularly effective for incrementally increasing copper removal rate. Preferably, the polyacrylic acid has a weight average molecular weight of 200 to 10,000.

It has been found that the optional addition of ammonium salts facilitates controlled removal rate of silicon oxide-containing layers, such as TEOS layers at acidic pH levels; and thus they permit controlling the silicon oxide-containing material's removal rate. The ammonium salts are organic ammonium salts formed with compounds to include the structure:

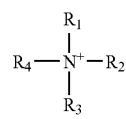

$R_1$, $R_2$, $R_3$ and $R_4$ are radicals that can be the same or different. The composition operates at acidic pH levels where the ammonium compound becomes ionized. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures thereof. It is possible to add the salt directly to the composition or to form the salt in situ. For example, adding tetrabutylammonium hydroxide (TBAH) to a nitric acid solution at a pH of 2.5 forms the tetrabutylammonium nitrate.

A preferable ammonium salt combination is that formed from reacting tetrabutylammonium hydroxide with hydrofluoric acid. This combination reacts at low pH levels to form a tetrabutylammonium fluoride salt. Although the exact mechanism is unclear (the fluoride salt dissociates to provide fluoride ions in solution), having organic ammonium fluoride salts in solution further accelerates the TEOS removal rate.

$R_1$ is an organic that has a carbon chain length of 2 to 15 carbon atoms. More preferably, $R_1$ has a carbon chain length of 2 to 10. Most preferably, $R_1$ has a carbon chain length of 2 to 5 carbon atoms. The organic of $R_1$ may be a substituted or unsubstituted aryl, alkyl, aralkyl, or alkaryl group.

Preferably, $R_2$, $R_3$ and $R_4$ are organic compounds, such as, a substituted or unsubstituted aryl, alkyl, aralkyl, or alkaryl group; or hydrogen. If $R_2$, $R_3$ or $R_4$ is an organic compound, then the organic compound preferably has a carbon chain length of 2 to 15 carbon atoms; more preferably, it has a carbon chain length of 2 to 10 carbon atoms; and most preferably it has a carbon chain length of 2 to 5 carbon atoms.

Suitable compounds for forming ammonium salts include tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido) propyltrimethylammonium, triethylenetetramine, tetramethylguanidine, hexylamine and mixtures thereof. Specific ammonium salts include tetraethyl ammonium nitrate, tetrabutylammonium fluoride, tetraethylammonium nitrate, tetraethylammonium fluoride, benzyltributylammonium chloride, benzyltrimethylammonium chloride, benzyltriethylammonium chloride, diallyldimethylammonium chloride, diallyldiethylammonium chloride, diethylaminoethyl methacrylate, dimethylaminoethyl methacrylate, methacryloyloxyethyltrimethylammonium sulfate, methacryloyloxyethyltrimethylammonium chloride, 3-(methacrylamido)

propyltrimethylammonium chloride, triethylenetetramine, tetramethylguanidine, hexylamine and mixtures comprising at least one of the foregoing. The preferred ammonium salts are tetraethyl ammonium salts, tetrabutylammonium salts, benzyltributylammonium salts, benzyltrimethylammonium salts, benzyltriethylammonium salts and mixtures thereof.

The ammonium salts are present in an amount of 1 ppm to 4 weight percent Preferably, the ammonium salt is present in an amount of 10 ppm to 2 weight percent. Most preferably, the ammonium salt is 25 ppm to 1 weight percent.

The solution enables the CMP apparatus to operate with a low pad pressure, for example at 7.5 to 25 kPa and, in certain cases, even below 7.5 kPa. The low CMP pad pressure improves polishing performance by reducing scratching and other undesired polish defects and decreases damage to fragile materials. For example, low dielectric constant materials fracture and delaminate, if exposed to high compressive forces. Further, the high barrier metal removal rate obtained by the acidic polishing solution enables effective barrier metal polishing using a low abrasive concentration and a small particle size.

For purposes of this specification, useful for preferentially removing barrier materials in the presence of nonferrous interconnect metals refers to removing the barrier material at a rate, as expressed in Angstroms per minute, of greater than the removal rate of the interconnect metal. Typically, the polishing solution has a tantalum nitride to copper selectivity of at least 1.5 to 1 as measured with a polishing pad pressure measured normal to a wafer less than 15 kPa. Preferably, the polishing solution has a tantalum nitride to copper selectivity of at least 2 to 1 as measured with a polishing pad pressure measured normal to a wafer less than 15 kPa. Most preferably, the polishing solution has a tantalum nitride to copper selectivity of at least 3 to 1. A specific example for testing the selectivity is the conditions, including the polyurethane polishing pad, of Example 3. This high level of selectivity allows a chip manufacturer to remove the barrier material without removing excess dielectric or interconnect material.

For purposes of this specification, limited dielectric erosion refers to a chemical mechanical polishing process where after polishing, the dielectric has sufficient thickness to act on behalf of its intended purpose, such as being a semiconducting, masking or barrier material. In addition, the polishing solution provides a flexible tantalum nitride to dielectric selectivity. For example, the polishing solution has a tantalum nitride to TEOS selectivity of 1 to 2 to as high as 10 to 1 as measured with a polishing pad pressure measured normal to a wafer less than 15 kPa. A specific example for testing the selectivity is the conditions, including the polyurethane polishing pad, of Example 3.

The polishing composition can also optionally include buffering agents such as various organic and inorganic acids, and amino acids or their salts with a pKa in the pH range of 1.5 to less than 3. The polishing composition can further optionally include defoaming agents, such as an non-ionic surfactants including esters, ethylene oxides, alcohols, ethoxylate, silicon compounds, fluorine compounds, ethers, glycosides and their derivatives, and the like. The defoaming agent can also be an amphoteric surfactant. The polishing composition may optionally contain biocides, such as Kathon® ICP III, containing active ingredients of 2-methyl-4-isothiazolin-3-one and 5-chloro-2-methyl-4-isothiazolin-3-one (Kathon is a registered trademark of Rohm and Haas Company).

EXAMPLES

Example 1

A list of solution compositions shown in Table 1 were prepared to evaluate the performance of two anti-yellowing additives (EDTA and citric acid) at varying concentration levels. In the preparation of the compositions-the requisite amounts of all required chemicals as shown in Table 1 (with the exception of the hydrogen peroxide and the abrasive) were added to deionized water in a container. The solution in the container is stirred until all the ingredients are dissolved in water. The abrasive was then added to the container. The pH of the solution was then adjusted to the target pH by the addition of nitric acid. Following this, the hydrogen peroxide was added to the container for use as a polishing composition.

The yellowing tests were conducted at room temperature without agitation. Slurries with different amounts of anti-yellowing additives were contained in plastic bottles. These bottles remained undisturbed in one location for up to 18 days. The color of these slurries at certain aging intervals as determined by visual observation was recorded and shown in Table 2. For purposes of this specification, letters represent comparative examples and numbers represent examples of the invention. Comparative slurry A, without any anti-yellowing complexing additives, was used as a control.

TABLE 1

| Slurry | BTA wt % | TBAH wt % | EDTA, sodium salt wt % | Citric acid wt % | Silica wt % | $H_2O_2$ wt % | pH |
|---|---|---|---|---|---|---|---|
| A | 0.6 | 0.085 | | | 4 | 0.5 | 2.5 |
| 1 | 0.6 | 0.085 | 0.001 | | 4 | 0.5 | 2.5 |
| 2 | 0.6 | 0.085 | 0.002 | | 4 | 0.5 | 2.5 |
| 3 | 0.6 | 0.085 | 0.005 | | 4 | 0.5 | 2.5 |
| 4 | 0.6 | 0.085 | 0.01 | | 4 | 0.5 | 2.5 |
| 5 | 0.6 | 0.085 | 0.03 | | 4 | 0.5 | 2.5 |
| 6 | 0.6 | 0.085 | 0.05 | | 4 | 0.5 | 2.5 |
| 7 | 0.6 | 0.085 | 0.1 | | 4 | 0.5 | 2.5 |
| 8 | 0.6 | 0.085 | 0.3 | | 4 | 0.5 | 2.5 |
| 9 | 0.6 | 0.085 | | 0.05 | 4 | 0.5 | 2.5 |
| 10 | 0.6 | 0.085 | | 0.1 | 4 | 0.5 | 2.5 |
| 11 | 0.6 | 0.085 | | 0.3 | 4 | 0.5 | 2.5 |

Note:
The silica of Table 1 was PL150H25 from Clariant having an average particle size of 25 nm.

TABLE 2

| Slurry | Day 0 | Day 4 | Day 5 | Day 7 | Day 11 | Day 14 | Day 18 |
|---|---|---|---|---|---|---|---|
| A | White | Yellow/ Light Brown | Yellow/ Light Brown | Brown | Brown | Brown | Brown |
| 1 | White | White | White | White | White | White | White |

TABLE 2-continued

| Slurry | Day 0 | Day 4 | Day 5 | Day 7 | Day 11 | Day 14 | Day 18 |
|---|---|---|---|---|---|---|---|
| 2 | White | White | White | White | White | White | White |
| 3 | White | White | White | White | White | White | White |
| 4 | White | White | White | White | White | White | White |
| 5 | White | White | White | White | White | White | White |
| 6 | White | White | White | White | White | White | White |
| 7 | White | White | White | White | White | White | White |
| 8 | White | White | White | White | White | White | White |
| 9 | White | Yellow/ Light Brown | Yellow/ Light Brown | Yellow/ Light Brown | Yellow/ Light Brown | Yellow/ Light Brown | Yellow/ Light Brown |
| 10 | White | White | White | White | Yellow/ Light Brown | Yellow/ Light Brown | Yellow/ Light Brown |
| 11 | White | White | White | White | Yellow/ Light Brown | Yellow/ Light Brown | Yellow/ Light Brown |

From the data, it is apparent that both additives facilitate eliminating or slowing down the yellowing reaction. EDTA is particularly effective. EDTA concentration as low as 10 ppm can keep the slurry from yellowing for 18 days.

Example 2

From example 1, slurries A, 2, 3 and 10 were selected for a polishing test to determine whether the presence of the additives affects wafer removal rates. In the test slurries, pH and concentration of $H_2O_2$ were slightly increased. Furthermore, EDTA in acidic form replaced the sodium salt of EDTA to reduce the total alkali ion concentration in the slurry. Similar to Example 1, slurries 12, 13 had the same effective molar concentrations of EDTA as slurries 2 and 3.

The polishing experiment was performed using a Mirra® model polishing tool manufactured by Applied Materials. The polishing pad was an IC1010™ porous polyurethane pad supplied by Rohm and Haas Electronic Materials CMP Technologies. The pad was conditioned prior to each run with a diamond abrasive plate manufactured by Kinik having 180 μm diamonds. The polishing process was performed at a membrane pressure of 10.33 kPa (1.5 psi), a table speed of 93 revolutions per minute (rpm) and a carrier speed of 87 rpm. The polishing composition supply rate was 200 ml/min using 200 mm blanket wafers. Cu and TaN removal rates were measured on a Four-Point Probe CDE Resmap. TEOS and Coral® carbon-doped oxide (CDO) film removal rates were measured by a ThermaWave Optiprobe® 2600 metrology tool.

The polishing rate data (in angstroms per minute) are shown in Table 3. Statistically, the data suggest that the anti-yellowing additives do not have a significant effect the film removal rates.

Example 3

This example examines the effect of the anti-yellowing additives on wafer defectivity.

The experiment was conducted on a Mirra® model polishing tool from Applied Materials. The polishing pad was an IC1010™ supplied by Rohm and Haas Electronic Materials CMP Technologies. The pad was conditioned prior to each run with a diamond abrasive plate manufactured by Kinik having 180 μm diamonds. The polishing process was performed at a pressure of 10.3 kPa (1.5 psi), a table speed of 93 revolutions per minute (rpm) and a carrier speed of 87 rpm. The CMP composition supply rate (slurry flow rate) was 200 milliliters/minute (ml/min). The 200 mm copper sheet wafers for the defectivity test were pre-polished by a commercially available slurry EPL2362 (manufactured by Eternal Chemical Co., Ltd.) for 1 minute using a CUP4410 pad (supplied by Rohm and Haas Electronic Materials CMP Technologies) and process parameters of 21.7 kPa (3 psi), 93 rpm table speed, 87 rpm carrier speed and 200 ml/min slurry flow rate. This step is to create a fresh copper surface. Then the pre-polished copper sheet wafer was polished by the slurry compositions in Table 4. After polishing, the defect counts were measured on an Orbot® defectivity tool manufactured by Applied Materials.

TABLE 3

| Slurry | BTA wt % | TBAH wt % | EDTA, acidic form wt % | Citric acid wt % | Silica wt % | $H_2O_2$ wt % | pH | Cu Å/min | TaN Å/min | TEOS Å/min | CDO Å/min |
|---|---|---|---|---|---|---|---|---|---|---|---|
| A | 0.6 | 0.085 | | | 4 | 0.6 | 2.6 | 28 | 1351 | 747 | 74 |
| 12 | 0.6 | 0.085 | 0.00154 | | 4 | 0.6 | 2.6 | 60 | 1347 | 695 | 81 |
| 13 | 0.6 | 0.085 | 0.0038 | | 4 | 0.6 | 2.6 | 65 | 1443 | 670 | 75 |
| 14 | 0.6 | 0.085 | | 0.1 | 4 | 0.6 | 2.6 | 107 | 1470 | 756 | 84 |

Note:
The silica of Table 1 was PL150H25 from Clariant having an average particle size of 25 nm.

The normalized defectivity data are shown in Table 4. Slurry A represents the normalized defectivity standard and was used as a control.

TABLE 4

| Slurry | Anti-yellowing additive, % | Fresh | Day 14 pot-life | Day 14 shelf-life | Day 30 shelf-life |
|---|---|---|---|---|---|
| A | No additive | 1.000 | 1.000 | 1.000 | 1.000 |
| 12 | 0.00154% EDTA | 0.913 | 0.578 | 0.936 | 0.843 |
| 13 | 0.0038% EDTA | 0.676 | 0.878 | 0.745 | 0.936 |
| 14 | 0.1% Citric acid | 0.815 | 0.843 | 0.843 | 0.682 |

The data show the inclusion of anti-yellowing additives does not degrade the defectivity performance, but improved wafer defectivity. There are little changes in defectivity with slurry pot-life and shelf-life aging, indicating that these slurries with anti-yellowing additives are stable.

Example 4

This example examines the effect of high-purity colloidal silica particles on the yellowing of pot-life slurry samples. The slurry preparation method and the yellowing test procedures were the same as those described in Example 1. The silica abrasive particle Fuso PL-3 from Fuso Chemical Co., Ltd. used in comparative slurry B (Table 5) had higher purity than the silica particle PL150H25 from Clariant. It has very low metal contamination. In particular, specifications for Fuso's PL-3 ultra-high-purity abrasive include silica 19.5 weight percent, primary particle size 34.6±4.4 nm, secondary particle size 70±10 nm, 300 ppb Na max., 200 ppb K max., 50 ppb Fe max., 200 ppb Al max., 200 ppb Ca max., 100 ppb Mg max., 100 ppb Ti max., 100 ppb Ni max., 100 ppb Cr max. and 100 ppb Cu max.

TABLE 5

| Slurry | BTA wt % | TBAH wt % | Silica Fuso PL-3 Wt % | Silica PL150H25 wt % | $H_2O_2$ Wt % | pH |
|---|---|---|---|---|---|---|
| A | 0.6 | 0.085 | | 4 | 0.5 | 2.5 |
| B | 0.6 | 0.085 | 4 | | 0.5 | 2.5 |

Table 6 shows a 7-day yellowing test under room temperature.

TABLE 6

| Slurry | Day 0 | Day 4 | Day 5 | Day 7 |
|---|---|---|---|---|
| A | White | Yellow/Light Brown | Yellow/Light Brown | Brown |
| B | White | White | White | White |

It is clear that the high-purity silica of slurry can further decrease the yellowing reaction. Although not necessary, the combination of high purity abrasive with the complexing agent provides the best stability and resistance to discoloration. From these tests it appears that trace transitional metal ions associated with abrasive particles catalyze a reaction between benzotriazole and $H_2O_2$ to discolor the slurry and that the reaction product discolors the polishing solution.

In summary, the combination provides a low-pH polishing solution with excellent stability and resistance to color change. This improved stability facilitates increased wafer yields by providing a polishing solution with predictable polishing performance over time. Furthermore, it possesses both a rapid removal of barrier materials, excellent selectivity to interconnect metals, excellent wafer defectivity and controlled removal rate of dielectric materials. Optionally, an organic-containing ammonium salt may increase the TEOS removal rate, abrasive particles increase low k dielectric removal rate and hydrogen peroxide controls the copper removal rate to provide polishing solutions adaptable for several integration schemes.

What is claimed is:

1. A polishing solution useful for preferentially removing barrier materials in the presence of nonferrous interconnect metals with limited erosion of dielectrics comprising: 0 to 20 weight percent oxidizer, at least 0.001 weight percent inhibitor for reducing removal rate of the nonferrous interconnect metals, 10 ppb to 4 weight percent complexing agent, 1 to 4 weight percent organic-containing ammonium salt formed with

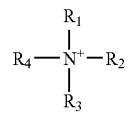

wherein $R_1$, $R_2$, $R_3$ and $R_4$ are organic radicals and $R_1$ has a cardon chain length of 2 to 5 carbon atoms, 0.1 to 50 weight percent colloidal silica abrasive and balance water; and the solution having a pH of less than 7; and the polishing solution being useful for removing a barrier layer with limited erosion of a dielectric material.

2. The polishing solution of claim 1 wherein the complexing agent is selecting from the group comprising ethylenediaminetetraacetic acid (EDTA) and citric acid.

3. The polishing solution of claim 1 wherein the ammonium salt is formed with a compound comprising at least one of tetraethyl ammonium, tetrabutylammonium, benzyltributylammonium, benzyltrimethylammonium, benzyltriethylammonium, diallyldimethylammonium, diethylaminoethyl methacrylate, dimethylaminoethyl methacrylate, methacryloyloxyethyltrimethylammonium, 3-(methacrylamido)propyltrimethylammonium and mixtures thereof.

4. The polishing solution of claim 1 wherein the solution contains nitric acid and the pH level of the polishing solution is 1.5 to 5.

5. A polishing solution useful for preferentially removing barrier materials in the presence of nonferrous interconnect metals with limited erosion of dielectrics comprising 0.01 to 15 weight percent oxidizer, 0.001 to 10 weight percent inhibitor for reducing removal rate of the nonferrous interconnect metals, 100 ppb to 2 weight percent complexing agent, 10 ppm to 2 weight percent organic-containing ammonium salt formed with

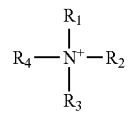

wherein $R_1$, $R_2$, $R_3$ and $R_4$ are organic radicals and $R_1$ has a carbon chain length of 2 to 5 carbon atoms, 0 to 10 weight percent surfactant, 0.1 to 40 weight percent colloidal silica abrasive and balance water; and the solution having a pH of less than or equal to 5; and the polishing solution being useful for removing a barrier layer with limited erosion of a dielectric material.

6. The polishing solution of claim 5 wherein the ammonium salt is formed with tetrabutylammonium.

7. The polishing solution of claim 5 wherein the ammonium salt is formed with a compound comprising at least one of tetraethyl ammonium, tetrabutylammonium, benzyltributylammonium, benzyltrimethylammonium, benzyltriethylammonium, diallyldimethylammonium, diethylaminocthyl methacrylate, dimethylaminoethyl methacrylate, methacryloyloxyethyltrimethylammonium, 3-(methacrylamido) propyltrimethylammonium and mixtures thereof.

8. The polishing solution of claim 5 wherein the solution contains nitric acid, the pH level of the polishing solution is 1.5 to 4 and the complexing agent includes at least one selected from the group comprising acetic acid, alanine, aspartic acid, ethyl acetoacetate, ethylene diamine, trimethylene diamine, ethylenediaminetetraacetic acid (EDTA), citric acid, lactic acid, malic acid, maleic acid, malonic acid, oxalic acid, triethylenetetramine, diethylene triamine, glycine, glycolic acid, gluteric acid, salicylic acid, nitrilotriacetic acid, ethylenediamine, hydroxyethylenethylenediaminetetraacetic acid, hydroxyquinoline, tartaric acid, sodium diethyl dithiocarbamate, succinic acid, sulfosalicylic acid, triglycolic acid thioglycolic acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, gallic acid, tannic acid, salts thereof and mixtures thereof.

9. The polishing composition of claim 5 wherein the complexing agent is selected from the group comprising ethylenediaminetetraacetic acid (EDTA).

10. A method of polishing semiconductor subsrates, including the step of:

polishing the semiconductor substrate with a polishing solution and a polishing pad, the polishing solution useful for preferentially removing barrier materials in the presence of nonferrous interconnect metals with limited erosion of dielectrics comprising: 0 to 20 weight percent oxidizer, at least 0.001 weight percent inhibitor for reducing removal rate of the nonferrous interconnect metals, 10 ppb to 4 weight percent complexing agent, 1 ppm to 4 weight percent organic-containing ammonium salt formed with

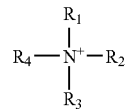

wherein $R_1$, $R_2$, $R_3$ and $R_4$ are organic radicals and $R_1$ has a carbon chain length of 2 to 5 carbon atoms, 0.1 to 50 weight percent colloidal silica abrasive and balance water; and the solution having a pH of less than 7; and the polishing solution being useful for removing a barrier layer with limited erosion of a dielectric material.

* * * * *